United States Patent
Sasaki et al.

(10) Patent No.: US 6,410,858 B1
(45) Date of Patent: Jun. 25, 2002

(54) MULTILAYERED WIRING BOARD, A PRODUCTION PROCESS FOR, AND SEMICONDUCTOR DEVICE USING, THE SAME

(75) Inventors: Masayuki Sasaki; Kazunari Imai, both of Nagano (JP)

(73) Assignee: Shinko Electric Industries Co. Ltd., Nagano (JP)

( * ) Notice: Subject to any disclaimer, the term of this patent is extended or adjusted under 35 U.S.C. 154(b) by 0 days.

(21) Appl. No.: 09/736,886

(22) Filed: Dec. 14, 2000

(30) Foreign Application Priority Data

Dec. 17, 1999 (JP) .......................................... 11-358619

(51) Int. Cl.[7] ................................................. H05K 1/03
(52) U.S. Cl. ...................... 174/255; 174/256; 174/200; 29/25.42; 361/301.1; 361/306.3; 361/321.2
(58) Field of Search ................................. 174/255, 256, 174/261, 260; 257/665; 29/25.42; 361/301.1, 303, 300.3, 321.2; 156/89.16

(56) References Cited

U.S. PATENT DOCUMENTS

| | | | | |
|---|---|---|---|---|
| 4,617,586 A | * | 10/1986 | Cuvilliers et al. | ........... 257/665 |
| 5,027,253 A | * | 6/1991 | Lauffer et al. | .............. 29/25.42 |
| 6,038,122 A | * | 3/2000 | Bergstedt et al. | ........... 361/303 |
| 6,094,336 A | * | 7/2000 | Weekamp | ................. 361/306.3 |
| 6,252,761 B1 | * | 6/2001 | Branchevsky | ............. 361/306.3 |

FOREIGN PATENT DOCUMENTS

| | | |
|---|---|---|
| EP | 0 469 449 | 2/1992 |
| EP | 0 655 440 | 5/1995 |
| JP | 2-032059 | 2/1990 |
| JP | 10-93246 | 9/1996 |
| JP | 8-225535 | 9/1996 |
| WO | 98/30548 | 7/1998 |

OTHER PUBLICATIONS

Silvio et al.; "Suppression of Mutagenic Activity of a Series of 5HT2c Receptor Agonsists by the Incorporation of a Gem–dimethyl Group: SAR Using the Ames Test and a DNA Unwinding Assay"; Chemical Abstracts Service; XP–002133774; Abstract, 1998.

* cited by examiner

*Primary Examiner*—Albert W. Paladini
(74) *Attorney, Agent, or Firm*—Paul & Paul

(57) ABSTRACT

A multilayered wiring board comprising, at least, two wiring layers and an interlaminar insulating layer, in which said wiring board further has, incorporated therein, at least one capacitor element which comprises a sandwiched structure of a lower electrode-forming metallic layer having formed thereon at least one recess portion, a dielectric layer formed over the lower electrode-forming metallic layer, and an upper electrode-forming metallic layer formed over the dielectric layer, and its production process. The semiconductor device comprising the multilayered wiring board having mounted thereon a semiconductor element is also disclosed.

19 Claims, 12 Drawing Sheets

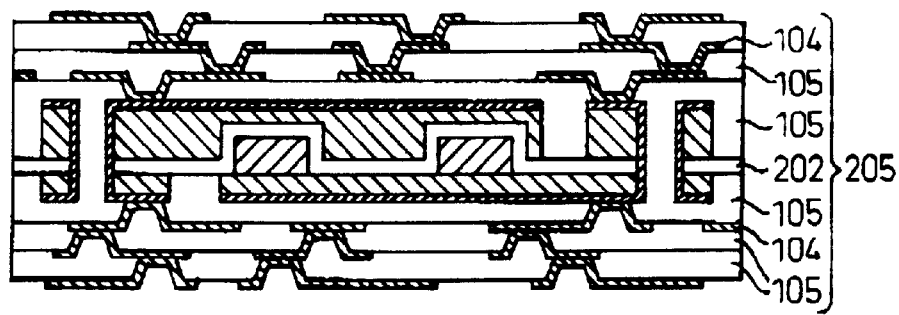

MULTILAYERED WIRING BOARD, A PRODUCTION PROCESS FOR, AND SEMICONDUCTOR DEVICE USING, THE SAME

BACKGROUND OF THE INVENTION

1. Field of the Invention

The present invention relates to a multilayered wiring board having incorporated therein a capacitor element, a production process thereof, and a semiconductor device using, such a multilayered wiring board. More particularly, the present invention is directed to the technology for reducing noise generated during simultaneous switching of semiconductor elements mounted on the multilayered wiring board.

2. Description of the Related Art

In recent years, there is a tendency that semiconductor elements are mounted at a high density, and with a high integration degree on a wiring board, to form a semiconductor device. Typical examples of such a semiconductor device which has been practically used include a PGA, i.e., a Pin Grid Array, and a BGA, i.e., a Ball Grid Array. Further, in these semiconductor devices, a multilayered wiring board comprising a plurality of laminated wiring Layers such as a signal layer and a power source layer has been used as the wiring board. In the semiconductor devices, the mounted semiconductor devices are electrically connected with the signal layer and the power source layer.

In addition, the multilayered wiring board has, provided thereon or therein, one or more capacitors. The capacitors act as a storage means for electric charge, and are used for different purposes and thus in different application forms. For example, Japanese Unexamined Patent Publication (Kokai) No. 10-93246 teaches a multilayered wiring board comprising a capacitor sandwiched between the wiring layers of the board to reduce the number of the elements or parts to be packaged in the board to thereby enable high density formation of the wiring along with a reduction in size of the finally produced semiconductor devices. More particularly, the multilayered wiring board of JPP'246, as illustrated in FIG. 1, has a multilayered wiring section 2, and the multilayered wiring section 2 has alternately disposed thin film wiring conductors 4a and 4b and others (not shown) which are electrically connected with each other through a through-hole conductor 9 (partly shown) formed in insulating layers 3a, 3b and 3c made of an organic resin. At least one layer of the organic insulating layers, i.e., layer 3b contains dielectric fillers having a dielectric constant of not less than 20 to form a high dielectric organic insulating layer. Thus, a capacitor is formed between the layer 3b and its lower wiring conductor 4a and upper wiring conductor 4b. Further, the upper wiring conductor 4b is laminated through a nickel layer 10 to an upper surface of the layer 3b to provide good bonding between these layers. Furthermore, the lower wiring conductor 4a has a surface roughness of $0.05 \mu m \leq (Ra) \leq 5 \mu m$ to also provide good bonding between this layer and the layer 3b. According to this multilayered wiring board, since a specific capacitor part is not required to be packaged in the board, it becomes possible to reduce the number of the parts to be included in the board.

Referring again to the uses of the capacitors in the multilayered wiring board, they include reducing noise generated during simultaneous switching of the semiconductor element mounted on the wiring board. This noise (hereinafter, referred to as "simultaneous switching noise") is generated as a result of simultaneous on-off operation of the switching elements in the semiconductor element, because such an operation can result in variation of the electrical potential in the source lines and ground lines which are used to supply electric power to the semiconductor element.

To reduce the simultaneous switching noise, it is well-known to insert a capacitor between the source line and the ground line in the multilayered wiring board. That is because, in the presence of the capacitor, the generated noise can be reduced as a result of absorption of the noise by the capacitance of the capacitor. Further, when the capacitor is used in the wiring board for the purpose of reducing the simultaneous switching noise, the noise can be effectively reduced with an increase in the capacity of the capacitor in the board.

Further, if a capacitor's disposed near the semiconductor element of the multilayered wiring board, a capacitance, in sum, of the capacitor and the wiring connected to the semiconductor element can be increased, because such disposal of the capacitor can reduce the resistance of the wiring connecting between the capacitor and the semiconductor element. Accordingly, it is desired, for the purpose of reducing a simultaneous switching noise, to dispose the capacitor in a neighborhood of the semiconductor element to obtain the shortened wiring distance between the capacitor and the semiconductor element.

Japanese Kokai 10-93246 cited above teaches a multilayered wiring board comprising a capacitor sandwiched between the wiring layers of the board. However, it does not teach use of the sandwiched capacitor in the reduction of the simultaneous switching noise. In addition, it is silent concerning use of a capacitor between the source line and the ground line in the wiring board.

Moreover, the capacitor described in Japanese Kokai 10-93246 has a problem that its capacity cannot be increased to the desired high level, because the capacity is varied depending upon the electrode area of the capacitor, and an upper limit of the electrode area is equivalent to the area of the wiring board having the mounted capacitor. Even if the electrode area of the capacitor is increased to obtain an increased capacity of the capacitor, it is impossible to increase the capacity above the capacity which is determined by the area of the wiring board.

For the above reasons, the capacitor of Japanese Kokai 10-93246 is not considered to be satisfactory as a capacitor for use in reduction of the simultaneous switching noise. It is therefore desired to provide an improved capacitor for use in the multilayered wiring board in which a capacity of the capacitor can be increased to an unexpectedly high Level, thus enabling sufficiently reduce a simultaneous switching noise, if generated

SUMMARY OF THE INVENTION

It is therefore an object of the present invention to provide a multilayered wiring board having incorporated therein a capacitor in which the sandwiched capacitor has a large-sized electrode and thus a simultaneous switching noise can be sufficiently reduced.

It is another object of the present invention to provide a process for the production of the improved multilayered wiring board of the present invention.

It is still another object of the present invention to provide a semiconductor device using the improved multilayered wiring board of the present invention.

These and other objects of the present invention will be easily understood from the following detailed description of the preferred embodiments of the present invention.

The inventors of the present invention have conducted intensive studies to accomplish the objects described above, and have discovered an improved multilayered wiring board.

According to one aspect of the present invention, there is provided a multilayered wiring board comprising, at least, two wiring layers and an interlaminar insulating layer sandwiched therebetween, in which said wiring board further has, incorporated therein, at least one capacitor element which comprises a sandwiched structure of:

a lower electrode-forming metallic layer having formed thereon at least one recess portion;

a dielectric layer formed over the lower electrode-forming metallic layer; and an upper electrode-forming metallic layer formed over the dielectric layer.

According to another aspect of the present invention, there is provided a process for the production of a multilayered wiring board comprising, at least, two is wiring layers and an interlaminar insulating layer sandwiched therebetween, and further having, incorporated therein at least one capacitor element, which process comprises the step of forming said capacitor element by:

forming a metallic layer on a substrate;

forming at least one opening on the metallic layer;

applying a surface covering metallic layer over a full surface of the opening-bearing metallic layer to form a lower electrode-forming metallic layer having formed thereon at least one recess portion;

depositing a dielectric material over the lower electrode-forming metallic layer to form a dielectric layer having a surface profile corresponding to that of the underlying lower electrode-forming metallic layer;

forming an upper electrode-forming metallic layer over the dielectric layer; and removing the substrate from the resulting capacitor element.

According to still another aspect of the present invention, there is provided a process for the production of a multilayered wiring board comprising, at least, two wiring layers and an interlaminar insulating layer sandwiched therebetween, and further having, incorporated therein, at least one capacitor element, which process comprises the step of forming said capacitor element by:

forming a metallic underlayer on a substrate;

further forming a pattern-forming metallic layer over the metallic underlayer;

fabricating a topographic pattern in the pattern-forming metallic layer to form a lower electrode-forming metallic layer comprising the metallic underlayer having applied theron the patterned metallic layer and having at least one recess on a surface thereof;

depositing a dielectric material over the lower electrode-forming metallic layer to form a dielectric layer having a surface profile corresponding to that of the underlying lower electrode-forming metallic layer;

forming an upper electrode-forming metallic layer over the dielectric layer; and removing the substrate from the resulting capacitor element.

Further, according to still another aspect of the present invention, there is provided a semiconductor device which comprises a multilayered wiring board comprising, at least, two wiring layers and an interlaminar insulating layer sandwiched therebetween, and further having, incorporated therein, at least one capacitor element which comprises a sandwiched structure of:

a lower electrode-forming metallic layer having formed thereon at least one recess portion;

a dielectric layer formed over the lower electrode-forming metallic layer; and an upper electrode-forming metallic layer formed over the dielectric layer, and at least one semiconductor element mounted in or on said multilayered wiring board.

DESCRIPTION OF THE PREFERRED EMBODIMENTS

Figure 1:
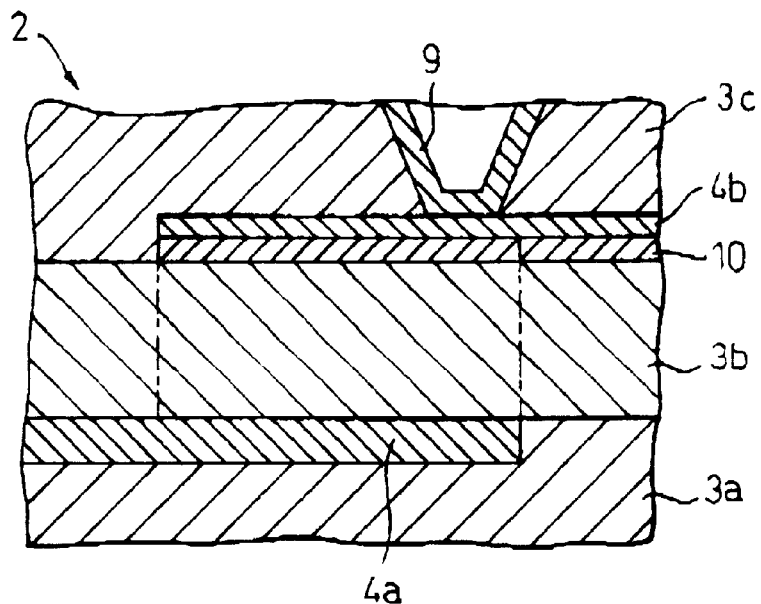
FIG. 1 is an enlarged cross-sectional view of a part of the prior art multilayered wiring board.

The present invention is further described with reference to the preferred embodiments thereof.

As mentioned above, the present invention resides in a multilayered wiring board which contains alternately laminated wiring layers and interlaminar or interlayer insulating (electrically isolating) layers. That is, the multilayered wiring board of the present invention contains at least one interlaminar insulating layer between two wiring layers. Further, the wiring board further has, incorporated in any desired position thereof, at least one capacitor element, and the capacitor has a sandwiched structure in which a dielectric layer is sandwiched between an upper electrode-forming metallic layer and a lower electrode-forming metallic layer. More particularly, the capacitor in the form of the sandwiched structure comprises:

a lower electrode-forming metallic layer having formed thereon at least one recess portion;

a dielectric layer formed over the lower electrode-forming metallic layer; and an upper electrode-forming metallic layer formed over the dielectric layer.

In the multilayered wiring board of the present invention, it is preferred that the lower electrode-forming metallic layer has a roughened surface to which said dielectric layer is laminated.

It is preferred in the multilayered wiring board that it additionally contains one or more bonding strength improving layers. Preferably, such a bonding strength improving layer is inserted between the lower electrode-forming metallic layer and the dielectric layer and/or between the upper electrode-forming metallic layer and the dielectric layer. Furthermore, such bonding strength improving layer may be formed from any metallic material and examples of a suitable metallic material, although not restricted to, include nickel, chromium or alloy thereof.

It is also preferred in the multilayered wiring board that one or both of the lower electrode-forming metallic layer and the upper electrode-forming metallic layer are formed from copper or alloy thereof, more preferably, copper alone, although any other metallic material may be used in the formation of these layers, if it is appropriate as an electrode material in the multilayered wiring board.

Further, any well-known dielectric material may be used in the formation of the dielectric layer between the upper electrode- and lower electrode-forming layers and examples of a suitable material, although not restricted to, include PZT (lead zirconate titanate), $BaTiO_3$, $SrTiO_3$ and $Ta_2O_5$. These dielectric materials may be used alone or in combination.

In addition to the multilayered wiring board, the present invention resides in a process for the production of the multilayered wiring board which, as described above, comprises, at least, two wiring layers and an interlaminar insulating layer sandwiched therebetween, and further has at least one incorporated capacitor element. The production process of the multilayered wiring board according to the present invention is characterized by producing the incorporated capacitor element in accordance with the following steps:

formation of a metallic layer on a substrate from any suitable electrode material, preferably copper or alloy thereof;

formation of at least one opening on the metallic layer;

application of a surface covering metallic layer over a full surface of the opening-bearing metallic layer from any suitable electrode material, preferably copper or an alloy thereof and, more preferably, copper alone, to form a lower electrode-forming metallic layer having formed thereon at least one recess portion;

deposition of a dielectric material, preferably, PZT, $BaTiO_3$, $SrTiO_3$, $Ta_2O_5$ or a combination thereof, over the lower electrode-forming metallic layer, to form a dielectric layer having a surface profile corresponding to that of the underlying lower electrode-forming metallic layer;

formation of an upper electrode-forming metallic layer from any suitable electrode material, preferably copper or alloy thereof and, more preferably, copper alone, over the dielectric layer; and removal of the substrate from the resulting capacitor element, In the production of the multilayered wiring board according to the present invention, the layers constituting the wiring board and the incorporated capacitor such as upper and lower electrode layers and dielectric layers may be formed at a desired layer thickness by using any conventional thin layer formation technologies. Typical examples of the thin layer formation technology useful in the practice of the present invention, although not restricted thereto, include a chemical vapor deposition (CVD) process, a vacuum evaporation process, a sputtering process and an epitaxial growth process. For example, the dielectric layer is preferably formed by a CVD process or a sputtering process.

Further, it is preferred that after the formation of the lower electrode-forming metallic layer, its surface to be contacted with the dielectric layer is roughened. A suitable roughening process and a desired range of the surface roughness will be described hereinafter.

Furthermore, it is preferred that, after the formation of the lower electrode-forming metallic layer and before the formation of the dielectric layer, a bonding strength improving layer is applied over the lower electrode-forming metallic layer to increase the bonding strength between these two layers, and that after the formation of the dielectric layer and before the formation of the upper electrode-forming metallic layer, a bonding strength improving layer is applied over the dielectric layer to increase the bonding strength between these two layers. The bonding strength improving layer was briefly described above, and the details of the bonding strength improving layer will be described hereinafter.

Moreover, in the capacitor element of the multilayered wiring board, its upper electrode-forming metallic layer is preferably formed by first forming a copper or copper alloy layer over the dielectric layer, followed by plating copper or copper alloy on a surface of the resulting copper or copper alloy layer. More preferably, copper is used alone.

The present invention also resides in another process for the production of a multilayered wiring board. The multilayered wiring board, as described above, comprises, at least, an interlaminar insulating layer sandwiched between two wiring layers and further has at least one capacitor element. This production process of the multilayered wiring layer is characterized in that the capacitor element is produced by the steps of:

forming a metallic underlayer on a substrate;

further forming a pattern-forming metallic layer over the metallic underlayer;

fabricating a topographic pattern in the pattern-forming metallic layer to form a lower electrode-forming metallic layer comprising the metallic underlayer having applied thereon the patterned metallic layer and having at least one recess on a surface thereof;

depositing a dielectric material over the lower electrode-forming metallic layer to form a dielectric layer having a surface profile corresponding to that of the underlying lower electrode-forming metallic layer;

forming an upper electrode-forming metallic layer over the dielectric layer; and removing the substrate from the resulting capacitor element.

Basically, the present production process of the multilayered wiring board is carried out in accordance with a procedure similar to that of the above-described production process of the multilayered wiring board except that according to the present production process, a metallic underlayer and a pattern-forming metallic layer are formed, in sequence, over the substrate, followed by fabricating a topographic pattern in the pattern-forming metallic layer to form a lower electrode-forming metallic layer. The preferred procedures of the above process can be similarly applied to the present process with satisfactory results. The "topographic pattern" applied to a surface of the pattern-forming metallic layer may include any combination of protrusions and recesses, insofar as such a pattern ensures the desired effects in the resulting capacitors. The profile of the protrusions and recesses are not restricted to the specific one. Generally, the topographic pattern is formed from a continuous profile of a protrusion and a recess adjacent to the protrusion.

According to the present process, the metallic underlayer and the pattern-forming metallic layer may be formed from the same or different materials, however, as is described hereinafter, it is preferred that these two layers are formed from the same metallic material such as copper or an alloy thereof or, more preferably, copper alone.

Further, it is preferred that after formation of the upper electrode-forming metallic layer, its surface is subjected to surface treatment such as polishing to obtain a flattened and thus even surface. More preferably, the upper electrode-forming metallic layer is formed by depositing a copper or copper alloy layer over the dielectric layer, followed by plating copper or copper alloy on a surface of the resulting copper or copper alloy layer.

In addition to the multilayered wiring board and the production process thereof, the present invention resides in a semiconductor device which comprises the multilayered wiring board of the present invention in combination with a semiconductor element. In the semiconductor device of the present invention, the capacitors) and the semiconductor element(s) may be mounted in any desired design in the multilayered wiring board of the present invention, however, to shorten the wiring length, it is preferred that they are disposed as close as possible. Further, the semiconductor element used in the semiconductor device is not restricted to and includes, for example, IC chips, LSI chips and the like. Of course, if desired, other conventional elements or parts such as inductor chips and resistors may be mounted on the multilayered wiring board, in addition to the capacitors) and the semiconductor element(s).

The present invention will be further described with reference to the accompanying drawings.

First, to assist in the understanding of the essential features of the present invention and the resulting functions and effects, the present invention is described with reference to the multilayered wiring board (enlarged cross-sectional view) illustrated in FIG. 3. As illustrated, the multilayered wiring board has a dielectric layer 102, used as a dielectric layer of a capacitor, formed on a lower electrode-forming copper layer 101, used as a lower electrode-forming metallic layer of a capacitor. The copper layer 101 has a recess portion 101c thereon. Further, an upper electrode-forming copper plating layer 103, used as an upper electrode-forming metallic layer of a capacitor, is formed on the dielectric layer 102. That is, a capacitor 113 is constituted from the lower electrode-forming copper layer 101, the dielectric layer 102 and the upper electrode-forming copper plating layer 103.

It is noted in the illustrated multilayered wiring board that a surface 101d of the lower electrode-forming copper layer 101, if its surface area is compared with that of a surface of the corresponding copper layer 101 having no recess portion 101c, has a larger surface area, because it has an additional surface area corresponding to a surface area of the side wall of the recess portion 101c contained therein.

Further, the dielectric layer 102 is formed in the capacitor 113 so that it has a surface profile corresponding to that of the underlying lower electrode-forming copper layer 101. Thus, a surface 102a of the dielectric layer 102 can contain a recess portion corresponding to the recess portion 101c of the lower electrode-forming copper layer 101.

Accordingly, the above-mentioned upper electrode-forming copper plating layer 103 is formed over a surface of the dielectric layer 102 having the recess portion. Therefore, in the resulting upper electrode-forming copper plating layer 103, its surface 103a contacting the dielectric layer 102 can have a surface area larger than that of the surface of the corresponding upper electrode-forming copper plating layer 103 deposited over the dielectric layer 102 having no recess portion. A difference of the surface area is substantially the same as the surface area of the side wall of the recess portion 101c.

As will be appreciated from the above, the lower electrode-forming copper layer (lower electrode) 101 of the capacitor 113 and the upper electrode-forming copper plating layer (upper electrode) 103 of the capacitor 113 each can have a larger surface area in comparison with that of the corresponding layer in the capacitor 113 having no recess portion 101c. As a result, the capacitor 113 can have a larger capacity than the corresponding capacitor 113 having no recess portion 101c.

Figure 3:
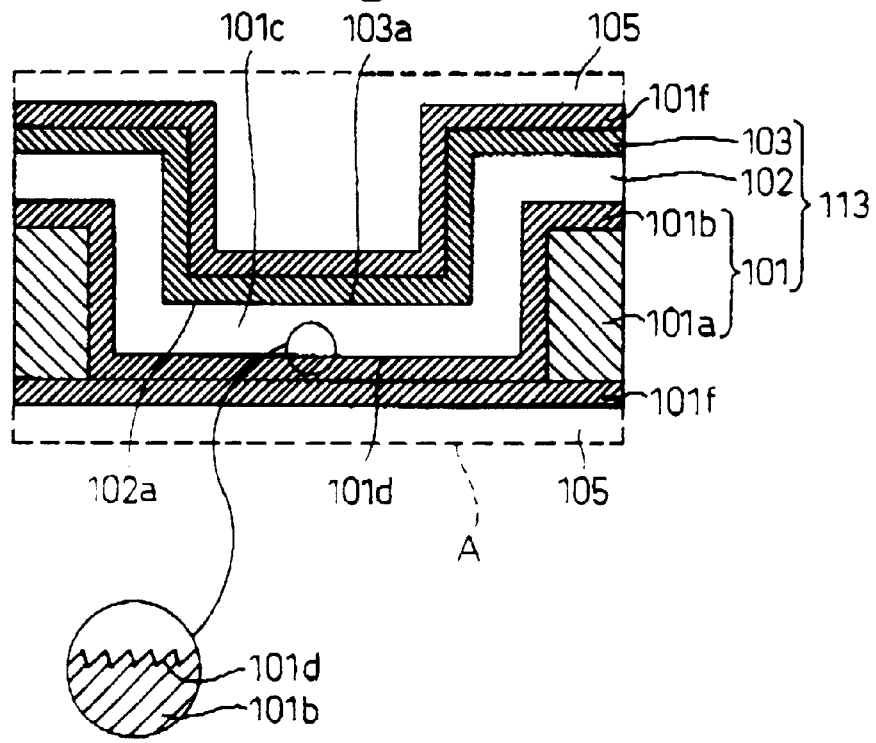
FIG. 3 is an enlarged cross-sectional view of the area "A" of the multilayered wiring board of FIG. 2.
Figure 5:
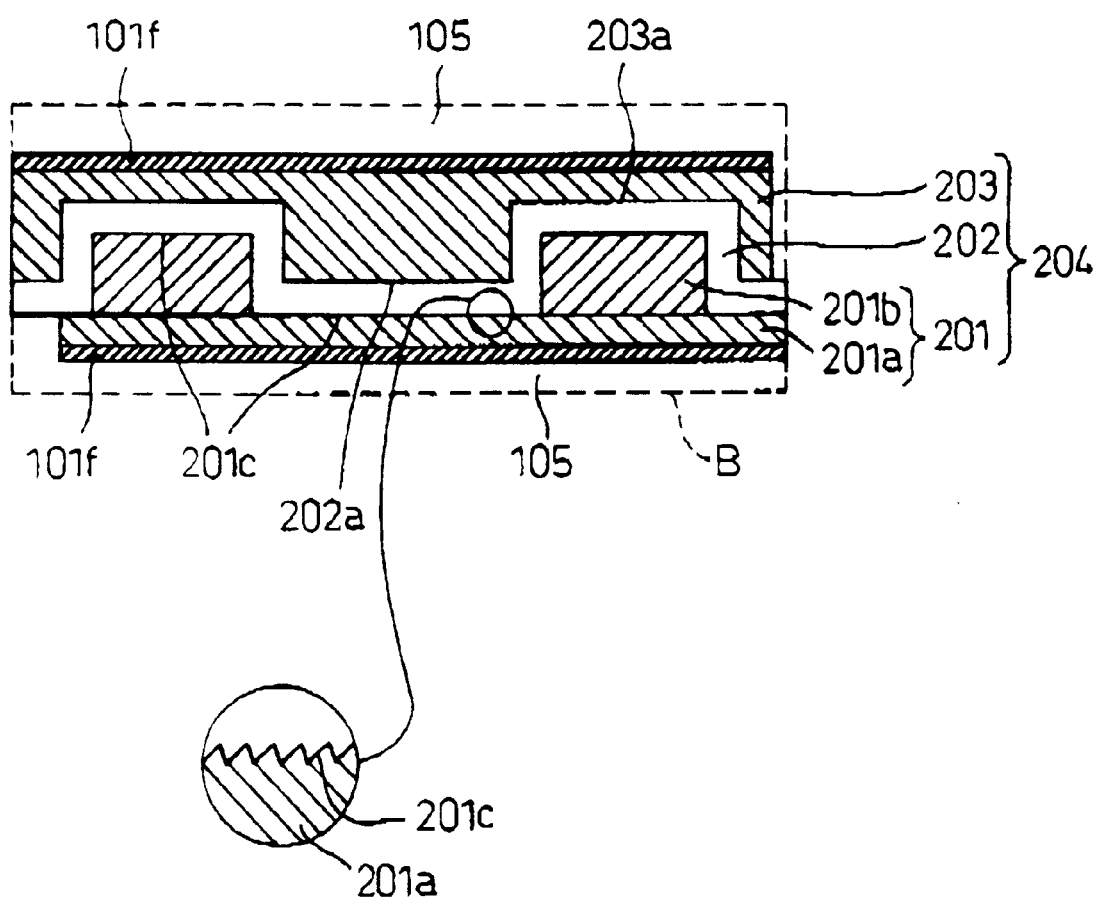
FIG. 5 is an enlarged cross-sectional view of the area "B" of the multilayered wiring board of FIG. 4.

The capacitor 113 in the multilayered wiring board of FIG. 3 may be modified as is illustrated in FIG. 5. That is, a lower electrode-forming copper layer 201 shown in FIG. 5 may be used in a capacitor 204, in place of the lower electrode-forming copper layer 101 containing the recess portion 101c.

As is shown in the capacitor 204 of FIG. 5, a lower electrode-forming copper layer 201 has on a surface thereof a topographic pattern (combination of protrusions and recesses) constituted from a pattern-forming copper plating layer 201b. Due to presence of the topographic pattern, the surface 201c of the lower electrode-forming copper layer 201 can have a larger surface area than the surface of the corresponding lower electrode-forming copper layer 201 having no topographic pattern.

In the illustrated instance, a dielectric layer 202 having a surface profile corresponding to the above-mentioned topographic pattern is formed over the lower electrode-forming copper layer 201. That is, the dielectric layer 202 has, on a surface thereof, a topographic pattern similar to the topographic pattern formed on a surface of the underlying lower electrode-forming copper layer 201.

Further, over the dielectric layer 202 having the specific surface profile, there is formed an upper electrode-forming copper plating layer 203. Accordingly, the upper electrode-forming copper plating layer 203 can also have the corresponding surface profile in a surface 203a contacting the underlying dielectric layer 202. Due to presence of the topographic pattern, a surface 203a of the upper electrode-forming copper plating layer 203 can have a larger surface area than the surface of the corresponding copper plating layer 203 having no topographic pattern in the underlying lower electrode-forming copper layer 201 and thus dielectric layer 202.

As a result, in the capacitor 204 constituted by the above-mentioned lower electrode-forming copper layer 201, dielectric layer 202 and upper electrode-forming copper plating layer 203, it becomes possible to obtain a larger surface area in both of the electrodes, formed from the copper layer 201 and the copper plating layer 203, in comparison to the corresponding capacitor 204 having no topographic pattern in the copper layer 201 and thus dielectric layer 202. Accordingly, the capacitor 204 can exhibit a larger capacitance than the corresponding capacitor 204 having no topographic pattern.

Moreover, in each of the above-described capacitors 113 and 204, the lower electrode-forming copper layer 101 or 201 may be subjected to a roughening treatment to form finely distributed topographic features or projections and recesses on a surface thereof. Examples of a suitable roughening treatment, although not restricted thereto, include a black oxide treatment and soft etching. Formation of such finely distributed topographic features in addition to the above-mentioned recesses or topographic patterns is effective to further increase the surface area of the lower electrode-forming copper layer 101 or 201 compared to a lower electrode-forming copper layer having only the recesses or topographic patterns.

In addition, the capacitors 113 and 204 may further contain a bonding strength improving layer for increasing a bonding strength between the two adjacent layers of the capacitors. Preferably, such a bonding strength improving layer is disposed between the lower electrode-forming copper layer 101 and the dielectric layer 102 of the capacitor 113. Alternatively or simultaneously, it may be inserted between the dielectric layer 102 and the upper electrode-forming copper plating layer 103. Similarly, it may be inserted between the lower electrode-forming copper layer 201 and the dielectric layer 202 and /or between the dielectric layer 202 and the upper electrode-forming copper plating layer 202. When the bonding strength improving layer is inserted in any desired position of the capacitor, it becomes possible to increase a bonding strength between upper and lower layers adjacent to this layer, thereby preventing peeling-off of the layers constituting the capacitor.

Next, the present invention will be further described with regard to typical examples of the multilayered wiring boards and semiconductor devices according to the preferred embodiments of the present invention, along with their production processes. Note, however, that the present invention should not be restricted to these examples, and the described multilayered wiring boards and semiconductor devices as well as their production processes may be freely modified or improved within the scope of the present invention.

Figure 2:
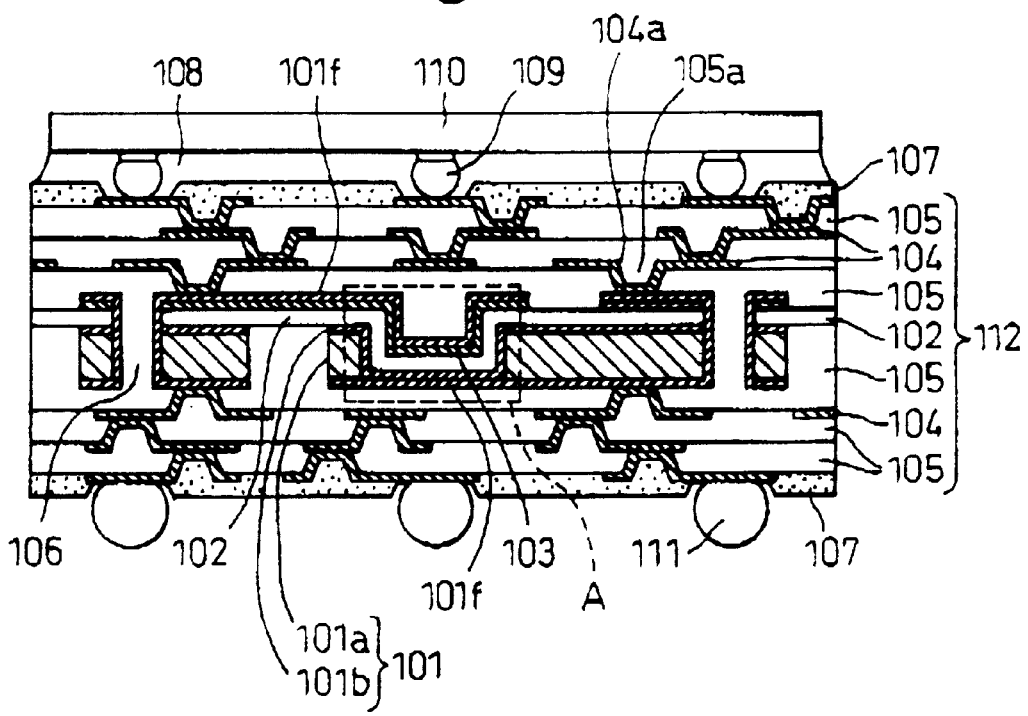
FIG. 2 is a cross-sectional view of the multilayered wiring board according to the first embodiment of the present invention.

(1) Multilayered Wiring Board and Semiconductor Device According to the First Embodiment of the Present Invention FIG. 2 is a cross-sectional view illustrating the multilayered wiring board according to the first embodiment of the present invention. In the multilayered wiring board 112, a lower electrode-forming copper layer (a metallic layer for forming a lower electrode of the capacitor) 101 has, laminated thereon, a dielectric layer (a dielectric layer of the capacitor) 102. The dielectric layer 102 may be formed from any dielectric material which is conventionally used in the formation of capacitors, preferably, dielectric materials having a higher dielectric constant. Examples of suitable dielectric material, although not restricted to, include PZT (lead zirconate titanate), $BaTiO_2$, $SrTiO_3$ and $Ta_2O_5$. Further, an upper electrode-forming copper plating layer (a metallic layer for forming an upper electrode of the capacitor) 103 s formed on the dielectric layer 102.

FIG. 3 is an enlarged cross-sectional view of the area "A", surrounded by a dotted line, of the multilayered wiring board of FIG. 2. As is illustrated, the lower electrode-forming copper layer 101 is constituted from a recess-forming copper plating layer (metallic layer) 101a and a surface coating-forming copper plating layer (metallic layer for forming a surface coating) 101b applied over the surface of the copper plating layer 101a. The lower electrode-forming copper layer 101 further contains a recess portion 101c formed therein. Note that the reference numeral 101f means a copper plating layer of the through-hole, and thus the copper plating layer 101f is applied to a surface of each of a through-hole 106 (see, FIG. 2), a lower electrode-forming copper layer 101 and an upper electrode-forming copper layer 103.

In FIG. 3, the lower electrode-forming copper layer 101 and the dielectric layer 102 have a surface 101d and 102a, respectively. A surface 102a of the dielectric layer 102 has a surface profile which is substantially the same as that of the surface 101d of the lower electrode-forming copper layer 101. In other words, the dielectric layer 102 is formed on the lower electrode-forming copper layer 101 in such a manner that the resulting dielectric layer 102 has a surface profile corresponding to that of the lower electrode-forming copper layer 101.

Further, the lower electrode-forming copper layer 101, as is shown in an enlarged circular cross-sectional view, surrounded by a solid line, in FIG. 3, has a roughened surface produced upon roughening treatment. That is, a surface 101d of the lower electrode-forming copper layer 101 has a plurality of fine projections and recesses. A capacitor 113 is thus formed from the above-described lower electrode-forming copper layer 101, dielectric layer 102 and upper electrode-forming copper plating layer 103.

Furthermore, although not shown, to obtain an increased bonding strength between the surface coating-forming copper plating layer 101b of the lower electrode-forming copper layer 101 and the dielectric layer 102, a bonding strength improving layer may be inserted between these two layers. Although the bonding strength improving layer used herein is not restricted to the specific one, it is preferred to form the bonding strength improving layer from a thin film of metals such as nickel, chromium and alloys thereof. Any conventional methods can be used in the formation of thin films of such metals. Similarly, a bonding strength improving layer may be formed from nickel, chromium and others between the dielectric layer 102 and the upper electrode-forming copper plating layer 103 to increase the bonding strength between these layers.

Referring again to FIG. 2, a interlaminar or interlayer insulating layer 105 is formed over the above-described copper plating layer 101f of the through-hole 106. The interlaminar insulating layer 105 may be formed from any conventional insulating materials. Examples of suitable insulating materials, although not restricted thereto, include photosensitive materials such as photosensitive polyimide resins, non-photosensitive resins and epoxy resins. The interlaminar insulating layer 105 is used herein to electrically isolate a wiring layer 104 from the underlying upper electrode-forming copper layer 103. AS is shown in FIG. 3, the through-hole 106 is a bored opening passed through each of the lower electrode-forming copper layer 101, the dielectric layer 102 and the upper electrode-forming copper plating layer 103, and an inner wall of the through-hole 106 has a copper plating layer 101f. In the capacitor 113 (see, FIG. 3), the copper plating layer 101f of the through-hole 106 enables to provide an electrical connection between the wiring layers 104 formed in each of the upper portion and lower portion of the capacitor 113.

Further, the interlaminar insulating layer 105 has a is via hole 105a, and the via hole 105a has a wiring-forming copper plating layer 104a in each of the side portion and the bottom portion thereof. Due to presence of the wiring-forming copper plating layer 104a, it becomes possible to electrically connect the wiring layers 104 formed on each of the upper and lower surfaces of the interlaminar insulating layer 105 with the upper electrode-forming copper plating layer 103. Note that the wiring layers 104 can be formed by depositing a wiring-forming copper plating layer 104 over the interlaminar insulating layer 105, followed by patterning the copper plating layer 104.

In the upper portion and the lower portion of the capacitor 113 (see, FIG. 3), the above-described wiring layer 104 and interlaminar insulating layer 105 are each alternately laminated to form a laminated structure consisting of two or more these layers. Thus, the multilayered wiring board 112 according to the illustrated embodiment of the present invention is constituted from the capacitor 113 which is further constituted from the lower electrode-forming copper layer 101, the dielectric layer 102 and the upper electrode-forming copper plating layer 103; the wiring layer 104; and the interlaminar insulating layer 105.

The multilayered wiring board 112 is advantageously used in the production of the semiconductor device. That is, a semiconductor element 110 is mounted through solder balls 109 on the multilayered wiring board 112. Further, a solder resist 107 and an underfilling agent 108 are used in the production of the semiconductor device. The underfilling agent 108 is used to moderate a differential stress between the wiring board 112 and the semiconductor element 110, thereby preventing cracks produced in the semiconductor element 110 due to the differential stress.

Moreover, the multilayered wiring board 112 is electrically and mechanically connected through solder balls 111 to a mother board (not shown). In other words, the semiconductor device constituted by the multilayered wiring board 112 according to the present embodiment and the semiconductor element 110 mounted thereon is a BGA (Ball Grid Array)-type semiconductor device capable of being mounted through solder balls onto a mother board.

Note, however, that the semiconductor device of the present invention provided with the above-described multilayered wiring board should not be restricted to the above BGA-type semiconductor device. The multilayered wiring board of the present invention can be advantageously applied to the production of any other types of the semiconductor devices. For example, a PGA (Pin Grid Array)-type semiconductor device in which pins are used as a connecting means in place of the solder balls of the BGA-type semiconductor device can be produced with the satisfactory functions and effects which are similar to those, described below, obtained in the BGA-type semiconductor device.

Referring again to FIGS. 2 and 3, in the capacitor 113 (see, FIG. 3), one of the lower electrode-forming copper layer 101 and the upper electrode-forming copper plating layer 103, both constituting the capacitor 113, can act as a source layer for supplying an electric power to the semiconductor element 110 of FIG. 2, and another one can act as a ground layer for grounding the semiconductor element 110. Accordingly, the capacitor 113 is inserted between the source layer and the ground layer of the multilayered wiring board 112, and can effectively act as a capacitor for reducing a simultaneous switching noise.

Further, as is explained hereinafter, the capacitor 113 can provide a remarkably increased capacitance in comparison with the prior art capacitor which is incorporated between the layers of the multilayered wiring board such as the capacitor described in the above-cited Japanese Kokai 10-93246.

As shown in FIG. 3, the capacitor 113 uses, as a lower electrode thereof, a lower electrode-forming copper layer 101 having a recess portion 101c. In comparison with the corresponding lower electrode-copper layer 101 having no recess portion 101c, the lower electrode-forming copper layer 101 has a larger surface area in the surface 101d. The increased amount of the surface area corresponds to a surface area of the side wall of the recess portion 101c of the copper layer 101.

In addition, as described above, a surface 101d of the lower electrode-forming copper layer 101 has projections and recesses produced by a roughening treatment. Thus, a surface 101d of the lower electrode-forming copper layer 101 has a surface area which is larger, in an amount corresponding to the surface area of the projections and recesses, than the surface of the corresponding copper layer not subjected to the roughening treatment.

Moreover, over the lower electrode-forming copper layer 101, a dielectric layer 102 is formed in such a manner that the dielectric layer 102 has a surface profile corresponding to that of the surface 101d of the lower electrode-forming copper layer 101. Therefore, in the upper electrode-forming copper plating layer 103 formed on the dielectric layer 102, its surface 103a contacting the dielectric layer 102 can also have a surface profile which As substantially the same as that of the surface 101d of the lower electrode-forming copper layer 101. Accordingly, a surface area of the surface 103a, contacting the dielectric layer 102, of the copper plating layer 103 is also larger than the surface area of the corresponding copper plating layer 103 having no recess portion 101c in the underlying lower electrode-forming copper layer 101.

As a result, since both electrodes of the capacitor 113, i.e., the lower electrode-forming copper layer (lower electrode) 101 and the upper electrode-forming copper plating layer (upper electrode) 103, can have a larger surface area than those of the corresponding capacitor 113 having no recess portion 101c and no applied roughening treatment in the lower electrode-forming copper layer 101, a large capacitance can be obtained in the capacitor 113, Thus, using the capacitor 113 as a capacitor for reducing a simultaneous switching noise, it becomes possible to more effectively reduce the simultaneous switching noise in comparison with the prior art capacitors because of its higher capacitance than that of the prior art capacitors.

In addition, since the capacitor 113 is inserted between the constitutional layers of the multilayered wiring board 112, a wiring distance between the semiconductor element 110 and the capacitor 113 can be shortened, in comparison with the prior art method in which a capacitor for reducing a simultaneous switching noise is simply mounted on a surface of the multilayered wiring board, thereby lowering the wiring resistance between the semiconductor element 110 and the capacitor 113. Thus, since a capacitance-increasing effect of the capacitor 113 is fully exhibited, a simultaneous switching noise can be more effectively reduced.

Note that, in connection with the above-described multilayered wiring board 112, that the use of the capacitor 113 is not restricted to only a capacitor for reducing a simultaneous switching noise, and the capacitor 113 can be satisfactory used in other purposes.

Figure 4:
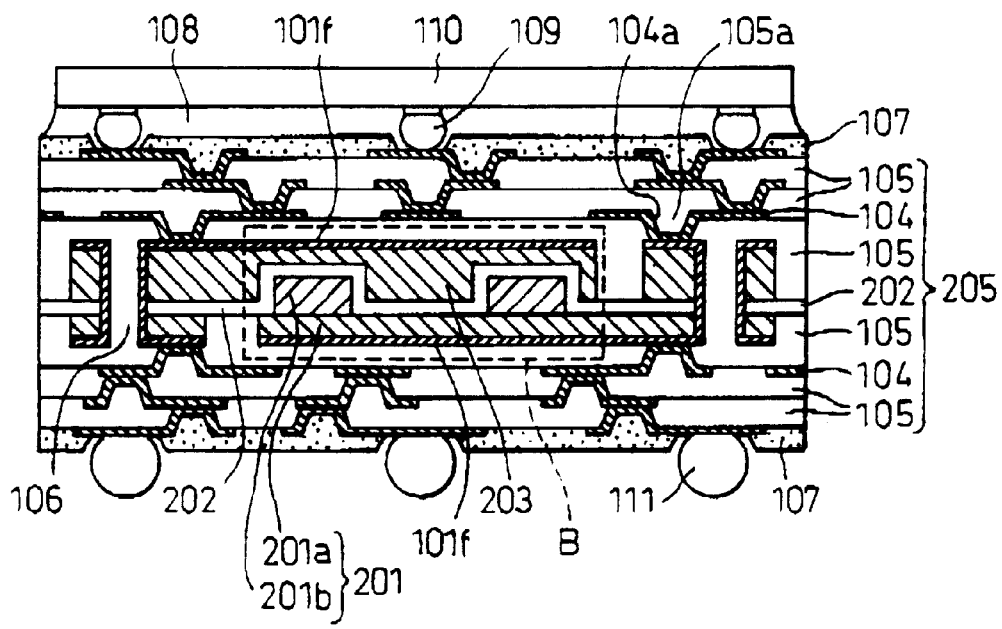
FIG. 4 is a cross-sectional view of the multilayered wiring board according to the second embodiment of the present invention.

(2) Multilayered Wiring Board and Semiconductor Device According to the Second Embodiment of the Present Invention FIG. 4 is a cross-sectional view illustrating the multilayered wiring board according to the second embodiment of the present invention. In the wiring board of FIG. 4, if its constitutional layer or part is identical with that described above with reference to FIG. 2, the same reference numeral will be given, and to avoid duplication, its description will be omitted.

In the multilayered wiring board 205 of FIG. 4, a lower electrode-forming copper layer (a metallic layer for forming a lower electrode of the capacitor) 201 has a topographic pattern, i.e., a combination of projections and recesses, on a surface thereof, and has, laminated thereon, a dielectric layer (a dielectric layer of the capacitor) 202. The dielectric layer 202 is preferably formed from a dielectric material having a higher dielectric constant such as PZT, $BaTiO_3$, $SrTiO_3$ and $Ta_2O_5$. Further, an upper electrode-forming copper plating layer (a metallic layer for forming an upper electrode of the capacitor) 203 is formed on the dielectric layer 202. In the illustrated wiring board, the reference numeral 101f means a copper plating layer of the through-hole, and thus the copper plating layer 101f is applied to a surface of each of a through-hole 106, a lower electrode-forming copper layer 201 and an upper electrode-forming copper layer 203.

FIG. 5 is an enlarged cross-sectional view of the area "B", surrounded by a dotted line, of the multilayered wiring board of FIG. 4. As is illustrated, the lower electrode-forming copper layer 201 is constituted from an underlying copper foil (metallic underlayer) 201a and a pattern-forming copper plating layer (metallic layer for forming a pattern) 201b applied over the surface of the copper foil 201a. A surface of the pattern-forming copper plating layer 201b has lands and lines formed upon patterning, as well as openings. Namely, in the lower electrode-forming copper layer 201, its topographic pattern is constituted from the lands and lines of the pattern-forming copper plating layer 201b.

In FIG. 5, the lower electrode-forming copper layer 201 and the dielectric layer 202 have a surface 201c and 202a, respectively. The dielectric layer 202 is formed on the lower electrode-forming copper layer 201 in such a manner that a surface 202a of the dielectric layer 202 has a surface profile which is substantially the same as that of the surface 201c of the lower electrode-forming copper layer 201. In other words, the dielectric layer 202 is formed on the lower electrode-forming copper layer 201 so that the resulting dielectric layer 202 has a surface 202a corresponding to the surface 201c of the lower electrode-forming copper layer 201.

Further, the lower electrode-forming copper layer 201, as is shown in an enlarged circular cross-sectional view, surrounded by a solid line, in FIG. 5, has a roughened surface 201c produced by a roughening treatment. That is, a surface 201c of the lower electrode-forming copper layer 201 has a plurality of fine projections and recesses. In the illustrated embodiment, a capacitor 204 is formed from the above-described lower electrode-forming copper layer 201, dielectric layer 202 and upper electrode-forming copper plating layer 203.

In the capacitor 204, although not shown, to obtain an increased bonding strength between the lower electrode-forming copper layer 201 and the dielectric layer 202, a bonding strength improving layer may be inserted between these two layers. Preferably, the bonding strength improving layer is formed from a thin film of metals such as nickel, chromium and alloys thereof. Similarly, a bonding strength improving layer may be formed from nickel, chromium and others between the dielectric layer 202 and the upper electrode-forming copper plating layer 203 to increase the bonding strength between these layers.

In the capacitor 204, one of the lower electrode-forming copper layer 201 and the upper electrode-forming copper plating layer 203 can act as a source layer for supplying an electric power to the semiconductor element 110 (see, FIG. 4) and the other can act as a ground layer for grounding the semiconductor element 110. Accordingly, since the capacitor 204 is inserted between the source layer and the ground layer, it can effectively act as a capacitor for reducing a simultaneous switching noise.

Further, the capacitor 204 can provide a remarkably increased capacitance in comparison with the prior art capacitor which is incorporated between the layers of the multilayered wiring board such as the capacitor described in the above-cited Japanese Kokai 10-93246.

The increased capacitance of the capacitor 204 is explained with reference to FIG. 5. As is illustrated, the lower electrode-forming copper layer 201 used as a lower electrode of the capacitor 204 has a patterned surface to provide projections and recesses. Thus, the copper layer 201 has a larger surface area than the corresponding copper layer having no projections and recesses. Namely, in comparison with the corresponding lower electrode-forming copper layer 201 having no patterned surface, the lower electrode-forming copper layer 201 has a larger surface area in the surface 201c. The difference in the surface area between these lower electrode-forming copper layers corresponds to a surface area of the side surface of the lands and lines formed in the pattern-forming copper plating layer 201b of the copper layer 201.

In addition, as described above, a surface 201c of the lower electrode-forming copper layer 201 has been subjected to roughening treatment to form fine projections. and recesses thereon. Thus, a surface 201c of the lower electrode-forming copper layer 201 has a larger surface area than the unroughened surface of the corresponding copper layer because of the presence of such projections and recesses.

Moreover, over the lower electrode-forming copper layer 201, a dielectric layer 202 is formed so that the dielectric layer 202 has a surface 202a having a profile corresponding to that of the surface 201a of the lower electrode-forming copper layer 201. Therefore, in the upper electrode-forming copper plating layer 203 formed on the dielectric layer 202, its surface 203a contacting the dielectric layer 202 can also have a surface profile which is substantially the same as that of the surface 201a of the lower electrode-forming copper layer 201. Accordingly, due to the same reasons mentioned above, a surface area of the surface 203a of the copper plating layer 203 is also larger than the surface area of the corresponding copper plating layer 203 having no patterned surface in the underlying lower electrode-forming copper layer 201.

In the upper portion and the lower portion of the capacitor 204 shown in FIG. 4, the above-described wiring layer 104 and interlaminar insulating layer 105 each is alternately laminated to form a laminated structure consisting of two or more these layers. Thus, the multilayered wiring board 205 according to the illustrated embodiment of the present invention is constituted from the capacitor 204 which is further constituted from the lower electrode-forming copper layer 201, the dielectric layer 202 and the upper electrode-forming copper plating layer 203; the wiring layer 104; and the interlaminar insulating layer 105.

In the multilayered wiring board 205, a semiconductor element 110 is mounted through solder balls 109 thereon. Further, the multilayered wiring board 205 is mounted through solder balls 111 on a mother board (not shown). Apparently, the illustrated semiconductor device is a BGA-type semiconductor device, however, it should be noted that the present invention should not be restricted to this specific semiconductor device. Namely, the present invention can be advantageously applied to the production of any other types of the semiconductor devices. For example, a PGA-type semiconductor device using pins in place of the solder balls of the BGA-type semiconductor device can be produced with satisfactory functions and effects which are similar to those obtained in the BGA-type semiconductor device.

As described above, according to the present invention, it becomes possible to increase a surface area of both electrodes of the capacitor 204 formed between the layers of the multilayered wiring board 205, and thus a capacitance of the capacitor 204, in comparison with the prior art multilayered wiring board. As a result, using the capacitor 204, the simultaneous switching noise can be more effectively reduced in comparison with the prior art wiring board.

In addition, the capacitor 204 is inserted between the constitutional layers of the multilayered wiring board 205. Therefore, a wiring distance between the semiconductor element 110 and the capacitor 204 can be shortened, in comparison with the prior art wiring board in which a capacitor for reducing a simultaneous switching noise is mounted on a surface of the wiring board, thereby lowering the wiring resistance between the semiconductor element 110 and the capacitor 204. Thus, since a capacitance-increasing affect of the capacitor 204 is fully exhibited, simultaneous switching noise can be more effectively reduced.

Note that, in connection with the above-described multilayered wiring board 205, the use of the capacitor 204 is not restricted to only use a capacitor for reducing a simultaneous switching noise, and the capacitor 204 can be satisfactory used for other purposes.

(3) Production of the Multilayered Wiring Board and Semiconductor Device According to the First Embodiment of the Present Invention The production of the multilayered wiring board 112 described above with reference to FIGS. 2 and 3 will be described below referring to FIGS. 6A to 6O, along with the production of the semiconductor device using the wiring board 112.

Figure 6A:
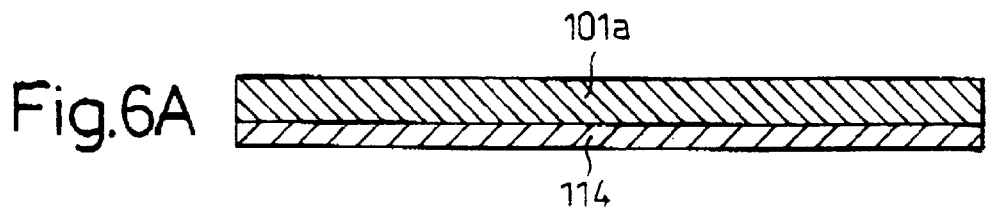
FIGS. 6A to 6O are cross-sectional views showing, in sequence, the production of the multilayered wiring board according to the first embodiment of the present invention.
Figure 6B:
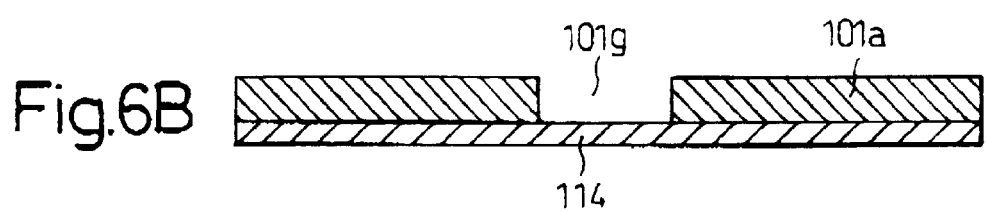

First, as shown in FIG. 6A, a recess-forming copper plating layer (metallic layer) 101a is deposited through electrolytic copper plating on a surface of the aluminum substrate (support) 114. Note that any other conventional substrate materials such as polyimide resin, epoxy resin and other resins may be used in place of aluminum, if desired. Assuming that the resin substrate is used in this step, it is contemplated to form the recess-forming copper plating layer 101a by using an electroless plating method.

Figure 6C:
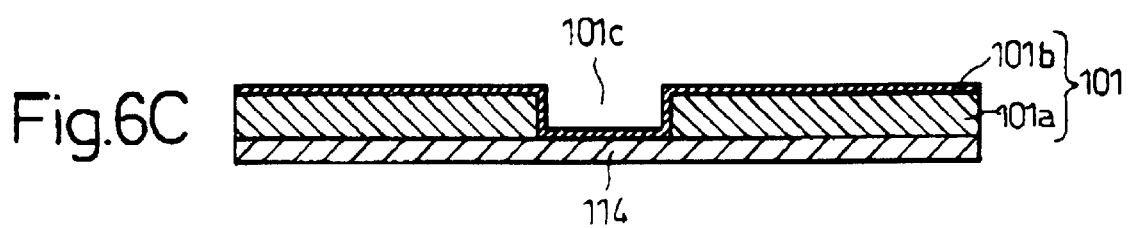

Next, as shown in FIG. 63, the recess-forming copper plating layer 101a is selectively etched off to form an opening 101g therein. The opening 101g corresponds to a recess portion 101c (see, FIG. 3), After formation of the opening 101g in the copper plating layer 101a, as shown in FIG. 6C, a surface coating-forming copper plating layer (metallic surface coating) 101b is formed over a full surface of the recess-forming copper plating layer 101a. Thus, a lower electrode-forming copper layer (a metallic layer for forming a lower electrode) consisting of the recess-forming copper plating layer 101a and the surface coating-forming copper plating layer 101b is formed on the aluminum substrate 114. In the resulting lower electrode-forming copper layer 101, a recess portion 101c is formed in a site corresponding to the opening 101g.

Figure 6D:
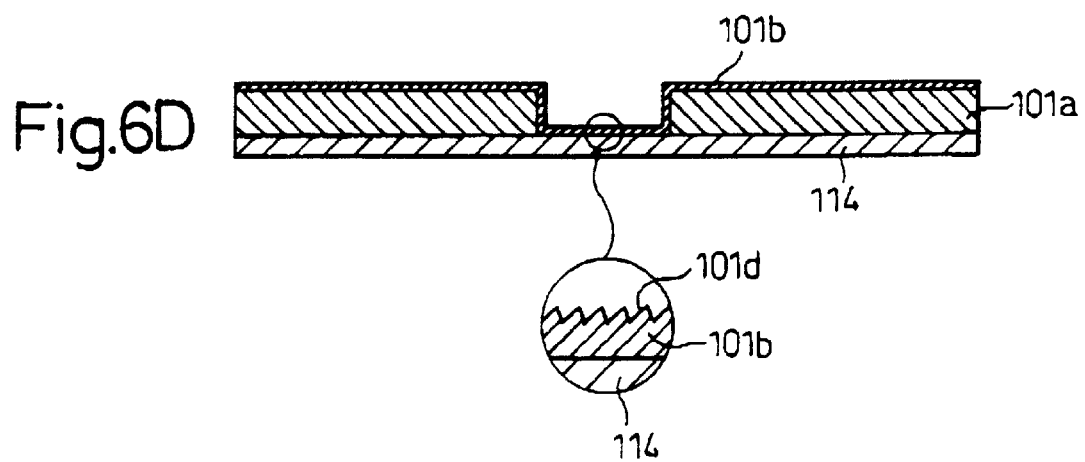

Thereafter, as shown in FIG. 6D, a surface roughening treatment is applied to the lower electrode-forming copper layer 101 to form fine projections and recesses in a surface 101d thereof. The resulting roughened surface 101d having fine projections and recesses is shown in an enlarged cross-sectional view (circle) of FIG. 6D.

The surface roughening treatment is preferably carried out by using a black oxide treatment or soft etching. For example, the black oxide treatment is carried out by spraying an oxidative aqueous solution such as aqueous solutions of sulfuric acid, hydrogen peroxide, sodium persulfate, potassium persulfate or a mixture thereof against the lower electrode-forming copper layer 101 to form the fine projections and recesses in a surface 101d thereof. The soft etching is carried out by dipping a surface 101d of the lower electrode-forming copper layer 101 in an oxidative aqueous solution, typical examples of which were mentioned above, to slightly etch off the surface 101d, thereby forming fine projections and recesses.

Figure 6E:
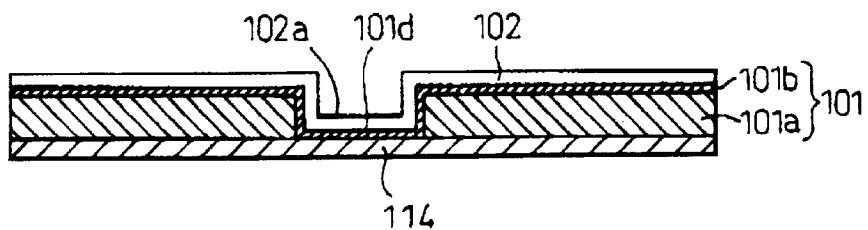

Then, as shown in FIG. 6E, a dielectric layer (a dielectric layer of the capacitor) 101 is deposited over the surface-roughened lower electrode-forming copper layer 101. The dielectric layer 102 is preferably formed from a dielectric material having a high dielectric constant such as PZT, $BaTiO_2$, $SrTiO_3$ and $Ta_2O_5$. Further, the deposition of the dielectric layer 102 may be carried out by using any conventional mechanical or chemical deposition methods, however, more preferably, the deposition of the dielectric layer 102 can be carried out by a chemical vapor deposition (CVD) method or sputtering. For example, using the CVD method, the dielectric layer 102 can be deposited with good coverage. Because of good coverage, a surface 102a of the resulting dielectric layer 102 can reproduce, with high accuracy, a surface profile of the surface 101d of the underlying lower electrode-forming copper layer 101.

Note that, before deposition of the dielectric layer 102, a thin layer of suitable metals such as chromium and nickel may be deposited by the CVD method, sputtering or other methods on a surface of the lower electrode-forming copper layer 101 to form an interlayer for increasing a bonding strength between the lower electrode-forming copper layer 101 and a dielectric layer 102 deposited thereon after formation of the interlayer.

Figure 6F:
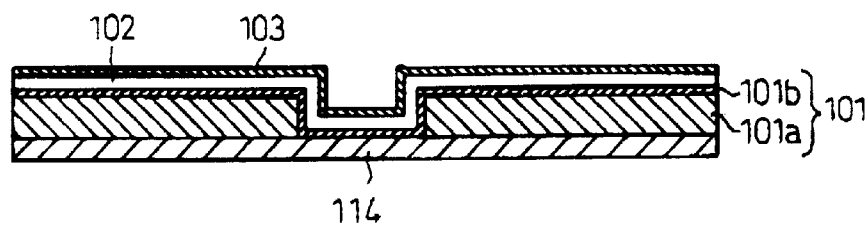

Next, as shown in FIG. 6F, an upper electrode-forming copper plating layer (a metallic layer for forming an upper electrode of the capacitor) 103 is formed over the dielectric layer 102. Although not shown, the upper electrode-forming copper plating layer 103 is preferably formed by first depositing a copper layer with sputtering or other deposition methods on a surface of the dielectric layer 102, followed by forming an electrolytic copper plating layer on the copper layer.

That is, according to the illustrated embodiment of the present invention, the upper electrode-forming copper plating layer 103 is a laminated product of the copper layer formed upon sputtering or others and the electrolytic copper plating layer. A bonding strength between the upper electrode-forming copper plating layer 103 and the underlying dielectric layer 102 can be increased as a result of the formation of the sputtered copper layer on the dielectric layer 102.

In the practice of the present invention, in place of forming the upper electrode-forming copper plating layer 103 in accordance with the above-described method, an electroless copper plating layer may be formed on the dielectric layer 102, followed by forming an electrolytic copper plating layer on the electroless copper plating layer. According to this method, the upper electrode-forming copper plating layer 103 is constituted from the electroless copper plating layer and the electrolytic copper plating layer.

Further, using the method similar to the method described above, the upper electrode-forming copper plating layer 103 may be formed, after a thin film of chromium or nickel, for example, was formed by the CVD method or sputtering. According to this method, a bonding strength between the upper electrode-forming copper plating layer 103 and the underlying dielectric layer 102 can be further increased.

Figure 6G:
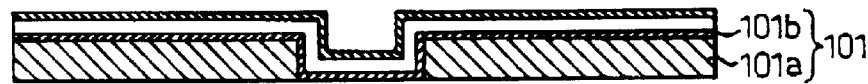

Next, as shown in FIG. 6G, the aluminum substrate 114 is removed by dipping a surface of the aluminum substrate 114 in an etching solution. In this etching process, it is necessary that the lower electrode-forming copper layer 101 has a good resistance to the etching solution to avoid its removal or separation from the dielectric layer 102. Accordingly, the etching solution used herein is preferred to have a higher etching rate with regard to aluminum than with regard to copper. For example, an aqueous solution of nitric acid can be preferably used as the etching solution.

Figure 6H:
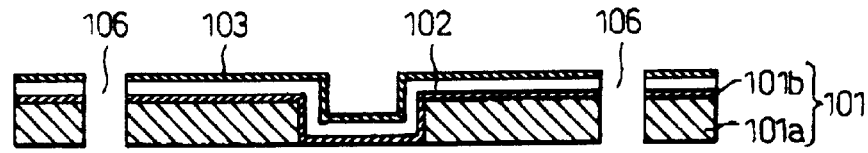

Next, as shown in FIG. 6H, the resulting lamination product is bored with a mechanical drill or other boring means to form through-holes 106 passed through the lower electrode-forming copper layer 101, the dielectric layer 102 and the upper electrode-forming copper plating layer 103.

Figure 6I:
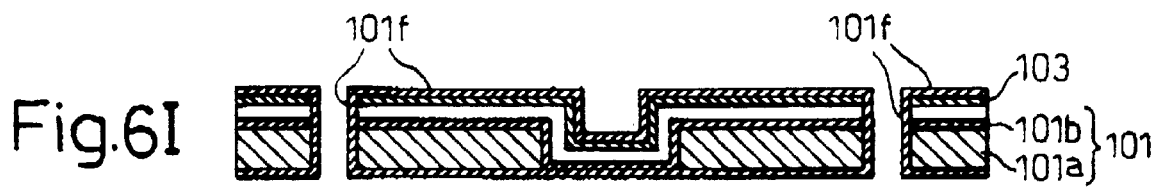

After formation of the through-holes 106, as shown in FIG. 6I, the lamination product is fully plated by using an electroless copper plating method, followed by applying an electrolytic copper plating. A through-hole copper plating layer 101f is thus formed. As is shown in FIG. 6I, the through-hole copper plating layer 101f is formed on a surface of the upper electrode-forming copper plating layer 103 and a surface of the lower electrode-forming copper layer 101, in addition to an inner wall of the through-holes 106.

Figure 6J:
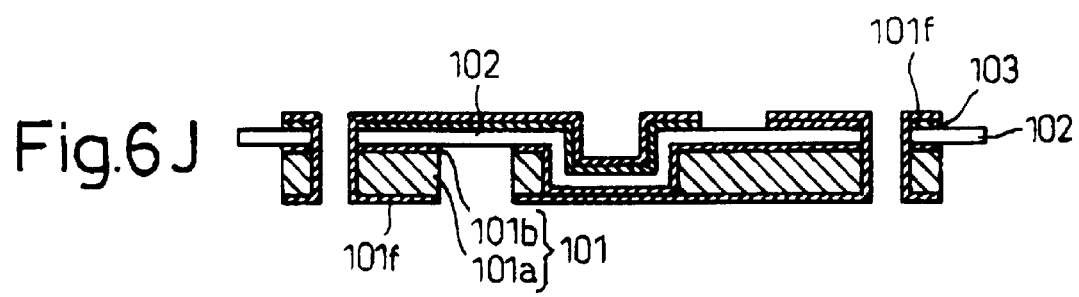

Thereafter, as shown in FIG. 6J, the upper electrode-forming copper plating layer 103 and the through-hole copper plating layer 101f, formed over the dielectric layer 102, and the lower electrode-forming copper layer 101 and the through-hole copper plating layer 101f, formed below the dielectric layer 102, are subjected to a patterning process to obtain the illustrated patterned product. For example, the patterning process can be carried out by coating a photoresist, (not shown) on a full surface of the through-hole copper-plating layer 101f, exposing and developing the photoresist coating to form a patterned masking means, and wet etching the exposed copper and copper plating layer through the masking means.

Figure 6K:
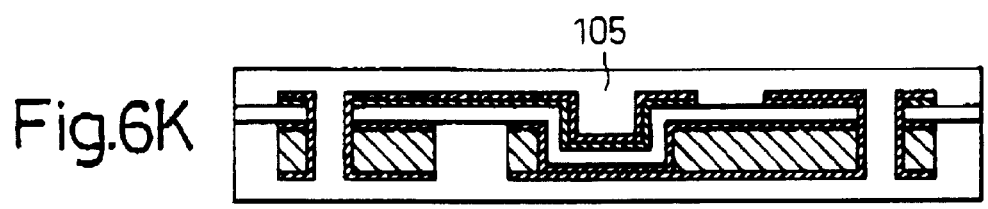

Next, as shown in FIG. 6K, the patterned product is fully covered with an interlaminar insulating layer 105. The interlaminar insulating layer 105 is preferably formed from a photosensitive polyimide resin, a non-photosensitive polyimide resin or an epoxy resin by using, for example, spin coating or brush coating.

Figure 6L:
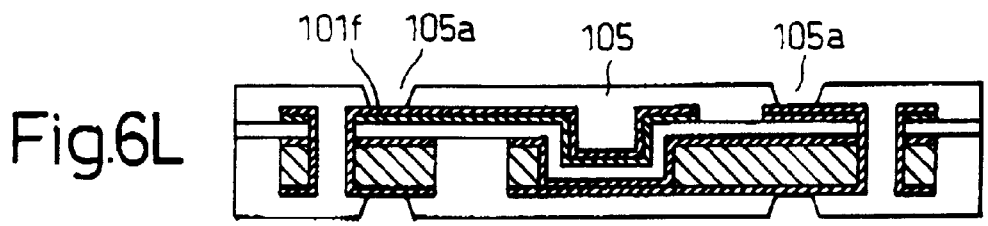

Next, as shown in FIG. 6L, via holes 105a are bored in the resulting interlaminar insulating layer 105. A surface of the through-hole copper plating layer 101f is thus exposed in the bottom of the via holes 105a.

Via holes 105a can be formed by using conventional boring methods. For example, when the interlaminar insulating layer 105 is made from a non-photosensitive polyimde resin or epoxy resin, the insulating layer 105 can be exposed to a pattern of laser beams to selectively remove the resin of the layer 105, thereby forming the via holes 105a. Alternatively, when the interlaminar insulating layer 105 is made from a photosensitive polyimide resin, the insulating layer 105 can be patternwise exposed to radiation and then developed with a suitable developer to selectively remove the resin of the layer 105, thereby forming the via holes 105a.

Figure 6M:
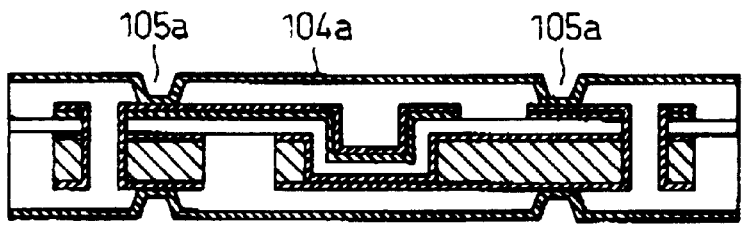

Thereafter, as shown in FIG. 6M, a copper plating layer 104a for forming a wiring is formed on a surface of the via holes-bored lamination product. Although not illustrated, the copper plating layer 104a is preferably formed by fully forming an electroless copper plating layer, followed by forming an electrolytic copper plating layer on the resulting electroless copper plating layer. As a result, a side wall and bottom surface of the via holes 105a are covered with the copper plating layer 104a.

Figure 6N:
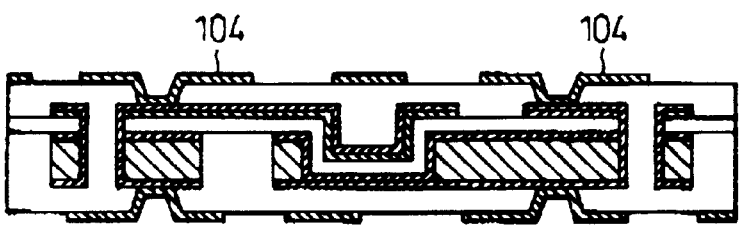

Next, a wiring layer 104 is formed over the interlaminar insulating layer 105 as shown in FIG. 6N. Conventional patterning processes may be used to form the wiring layer 104.

After formation of the wiring layer 104, the procedures explained above with reference to FIGS. 6K to 6N are repeated to alternately laminate the interlaminar insulating layer 105 and the wiring layer 104. The number of the repeated procedures can be varied depending upon the lamination structure of the desired multilayered wiring board.

Figure 6O:
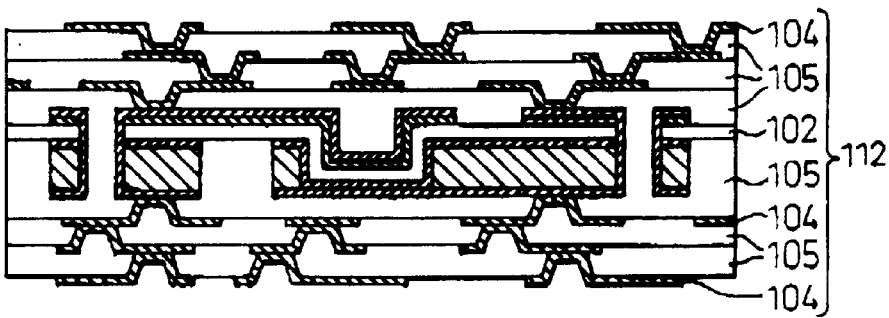

Finally, as shown in FIG. 6O, the multilayered wiring board 112 is produced. The multilayered wiring board 112 corresponds to the multilayered wiring board 112 shown in FIG. 2, and, as can be appreciated from the cross-section of the board, comprises six (6) interlaminar insulating layers 105 and six (6) wiring layers 104, alternately laminated. In the multilayer wiring board 112, as described above with reference to FIG. 2, a semiconductor element can be mounted through a solder ball on a predetermined site of the wiring board 112 to form a semiconductor device.

(4) Production of the Multilayered Wiring Board and Semiconductor Device According to the Second Embodiment of the Present Invention The production of the multilayered wiring board 205 described above with reference to FIGS. 4 and 5 will be described below referring to FIGS. 7A to 7Q, along with the production of the semiconductor device using the wiring board 205.

Figure 7A:
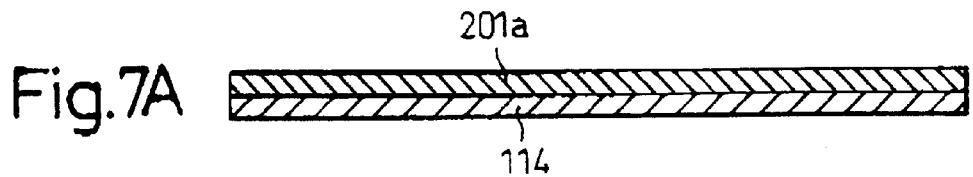
FIGS. 7A to 7Q are cross-sectional views showing, in sequence, the production of the multilayered wiring board according to the second embodiment of the present invention.

First, as shown in FIG. 7A, an aluminum substrate (support) 114 having an underlying copper foil (a metallic underlayer) 201a on one surface thereof is provided. Note, however, that in place of providing such an aluminum substrate, an aluminum substrate having deposited on a surface thereof a copper plating layer can be provided. Namely, in the latter case, the copper plating layer can act as the metallic underlayer. Alternatively, if desired, a resinous substrate may be used as the support, and in such a case, preferably, an electroless copper plating layer is deposited over the resinous substrate to form the metallic underlayer.

Figure 7B:
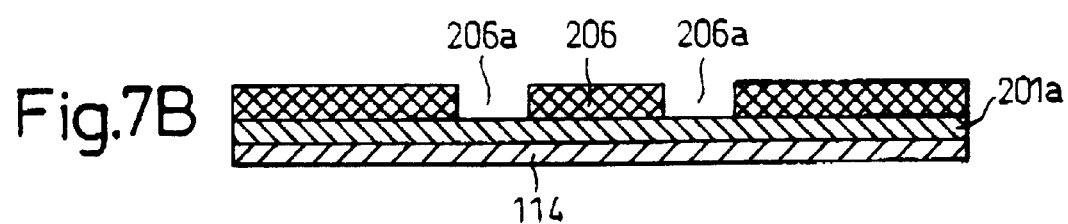

Next, as shown in FIG. 7B, a photoresist 206 is coated over a surface of the underlying copper foil 201a, followed by patternwise exposing and developing the photoresist 206. Openings 206a are formed in the photoresist 206 an a result of the selective removal of the photoresist 206. The openings 206a have a profile of lands and lines, and a bottom portion of the openings 206a has an exposed surface of the underlying copper foil 201a.

Figure 7C:
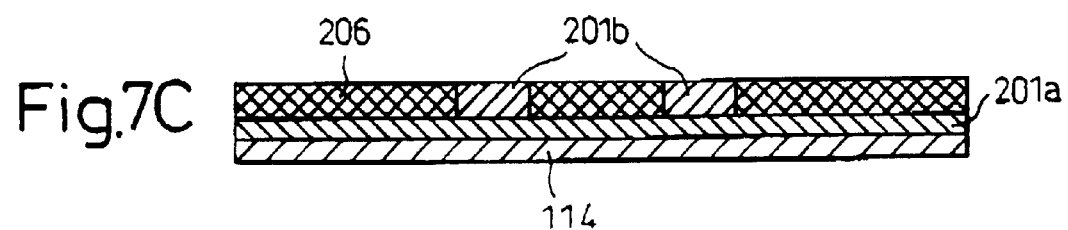

Next, as shown in FIG. 7C, a lower electrode-forming copper layer 201b is formed on the exposed underlying copper foil 201a. The lower electrode-forming copper layer 201b is preferably formed with an electrolytic copper plating process by using the underlying copper foil 201a as an electric current supply layer. Copper is thus selectively deposited on the underlying copper foil 201a exposed from the openings 206a of the photoresist 206. Since the openings 206a have a profile such as lands and lines, the resulting lower electrode-forming copper layer 201b also has a profile such as lands and lines.

Figure 7D:
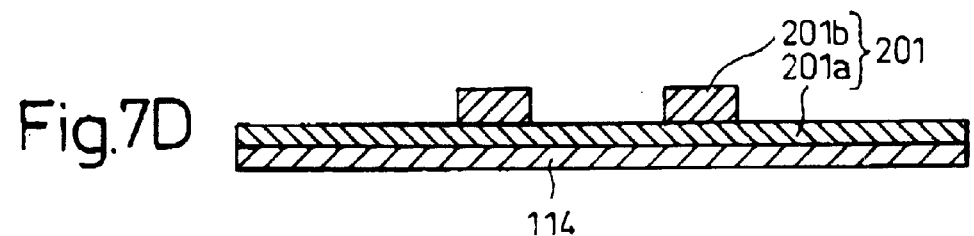

After completion of the formation of the lower electrode-forming copper layer 201b, the used photoresist 206 is removed with a suitable remover. As a result, as shown in FIG. 7D, a lower electrode-forming copper layer 201 consisting of the underlying copper foil 201a and the pattern-forming copper plating layer 201b is formed on the aluminum substrate 114.

Figure 7E:
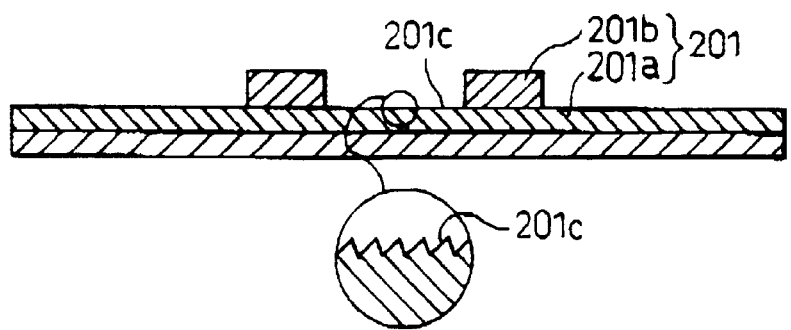

Thereafter, as shown in FIG. 7E, a surface roughening treatment is applied to the lower electrode-forming copper layer 201 to form fine projections and recesses in a surface 201c thereof. The resulting roughened surface 201c having fine projections and recesses is shown in an enlarged cross-sectional view (circle) of FIG. 7E.

As already explained with reference to FIG. 6D, the surface roughening treatment is preferably carried out by using a black oxide treatment or soft etching. The black oxide treatment is preferably carried out by spraying an oxidative aqueous solution such as aqueous solutions of sulfuric acid, hydrogen peroxide, sodium persulfate, potassium persulfate or a mixture thereof against the lower electrode-forming copper layer 201 to form the fine projections and recesses in a surface 201c thereof. The soft etching is preferably carried out by dipping a surface 201c of the lower electrode-forming copper layer 201 in any one of the above-mentioned oxidative aqueous solutions to slightly etch off the surface 201c.

Figure 7F:
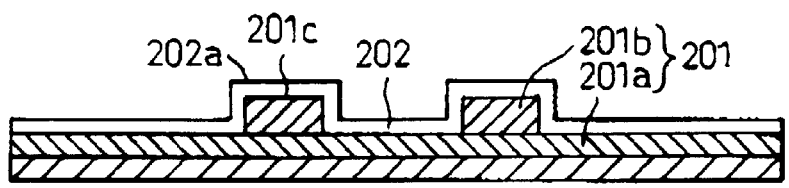

After completion of the surface roughening treatment, as shown in FIG. 7F, a dielectric layer (a dielectric layer of the capacitor) 202 is deposited over the surface-roughened lower electrode-forming copper layer 201. The dielectric layer 202 is preferably formed from a dielectric material having a high dielectric constant such as PZT, $BaTiO_2$, $SrTiO_3$ and $Ta_2O_5$. Preferably, the dielectric layer 202 is formed by a CVD method or sputtering. As already explained, if the CVD method is used in the formation of the dielectric layer 202, the dielectric layer 202 can be deposited with a good coverage, and thus a surface 202a of the resulting dielectric layer 202 can have a surface profile which is substantially the same as that of the surface 201c of the underlying lower electrode-forming copper layer 201.

In this connection, after formation of the lower electrode-forming copper layer 201 and before deposition of the dielectric layer 202 thereon, it is contemplated to form a thin layer of suitable metals such as chromium and nickel by the CVD method, sputtering or other methods on a surface of the lower electrode-forming copper layer 201 to form an interlayer for increasing a bonding strength between the lower electrode-forming copper layer 201 and the dielectric layer 202.

Figure 7G:
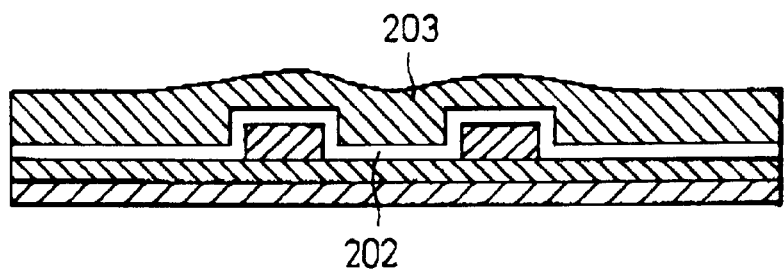

Thereafter, as shown in FIG. 7G, an upper electrode-forming copper plating layer 203 is formed over the dielectric layer 202 by using an electrolytic plating method. In this formation of the upper electrode-forming plating layer 203, as already described, it is contemplated to form a thin layer of suitable metals such as chromium or nickel with the CVD method or sputtering on the dielectric layer 202, prior to formation of the copper plating layer 203. The formation of the above interlayer is particularly effective to increase a bonding strength between the copper plating layer 203 and the underlying dielectric layer 202.

Further, as in the first embodiment mentioned above, the upper electrode-forming copper plating layer 203 may be formed by first depositing a copper layer with sputtering on a surface of the dielectric layer 202, followed by forming an electrolytic copper plating layer on the copper layer. This method is also effective to increase a bonding strength between the dielectric layer 202 and the copper plating layer 203.

Figure 7H:
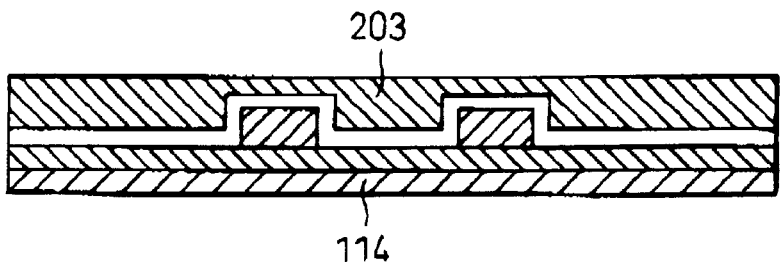

After formation of the upper electrode-forming copper plating layer 203, as shown in FIG. 7H, a surface of the resulting copper plating layer 203 is polished with a Chemical Mechanical Polishing (CMP) method to obtain a flat and smooth surface. The polishing process can be effectively carried out without causing deformation of the copper plating layer 203, because the layer 203 has the underlying aluminum substrate 114.

Figure 7I:
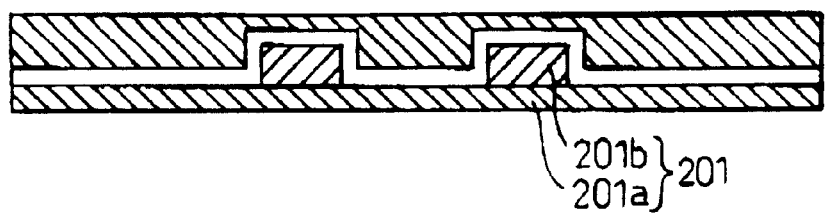

Next, as shown in FIG. 7I, the aluminum substrate 114 is dipped in an etching solution to remove it from the lamination product. In this etching process, it is necessary that the lower electrode-forming copper layer 201 is protected from the etching solution to avoid its removal or separation from the dielectric layer 202. Therefore, the etching solution used herein is required to have a higher etching rate with regard to aluminum than with regard to copper.

Figure 7J:
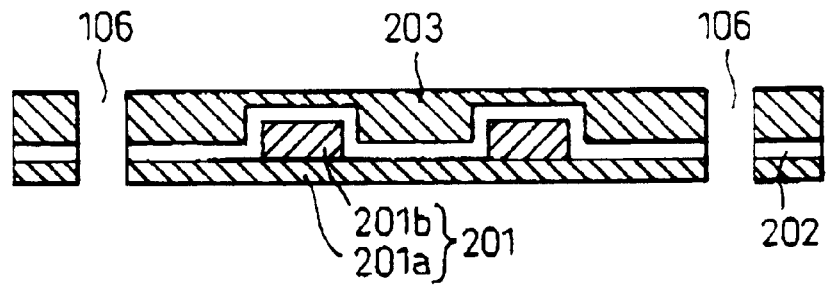

Next, as shown in FIG. 7J, the resulting lamination product is bored with a mechanical drill to form through-holes 106 passed through the lower electrode-forming copper layer 201, the dielectric layer 202 and the upper electrode-forming copper plating layer 203.

Figure 7K:
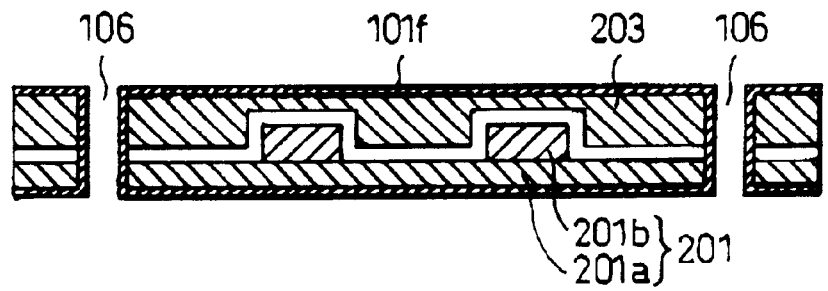

After formation of the through-holes 106, as shown in FIG. 7K, the lamination product is fully plated by using an electroless copper plating method, followed by applying an electrolytic copper plating. A through-hole copper plating layer 101f is thus formed. As is appreciated from FIG. 7K, the through-hole copper plating layer 101f is formed on a surface of the upper electrode-forming copper plating layer 203 and a surface of the lower electrode-forming copper layer 201, in addition to an inner wall of the through-holes 106.

Figure 7L:
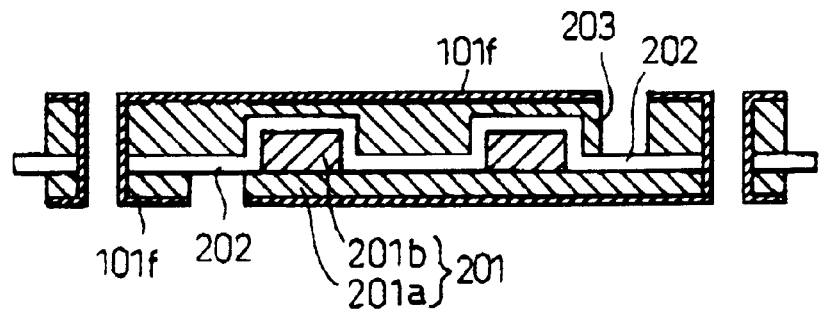

Thereafter, as shown in FIG. 7L, the upper electrode-forming copper plating layer 203 and the through-hole copper plating layer 101f, formed over the dielectric layer 202, and the lower electrode-forming copper layer 201 and the through-hole copper plating layer 101f, formed below the dielectric layer 202, are subjected to a patterning process to obtain the illustrated patterned product. In the illustrated instance, the patterning process was carried out by coating a photoresist (not shown) on a full surface of the through-hole copper plating layer 101f, exposing and developing the photoresist coating to form a patterned masking means, and wet etching the exposed copper and copper plating layer through the masking means.

Figure 7M:
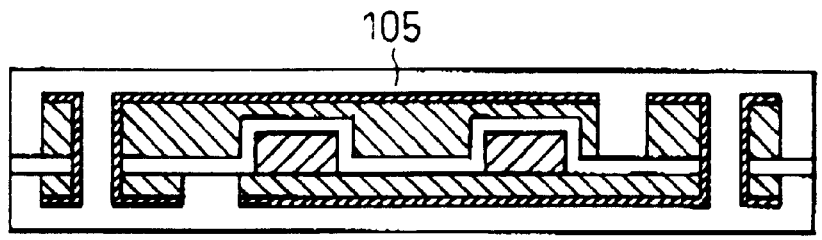

Following to the above patterning process, as shown in FIG. 7M, the patterned product is fully covered with an interlaminar insulating layer 105. The interlaminar insulating layer 105 is preferably formed from a photosensitive polyimide resin, a non-photosensitive polyimide resin or an epoxy resin by using, for example, spin coating or brush coating. Other insulating materials and coating methods may be used, if desired.

Figure 7N:
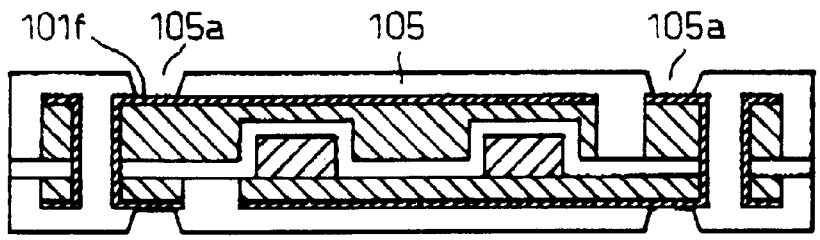

Next, as shown in FIG. 7N, via holes 105a are bored in the interlaminar insulating layer 105. A surface of the underlying through-hole copper plating layer 101f is thus exposed in the bottom of the via holes 105a.

For example, when the interlaminar insulating layer 105 is made from a non-photosensitive polyimde resin or epoxy resin, the insulating layer 105 can be exposed to a pattern of laser beam to selectively remove the resin of the layer 105, thereby forming the via holes 105a. Alternatively, when the interlaminar insulating layer 105 is made from a photosensitive polyimide resin, the insulating layer 105 can be patternwise exposed to any exposure radiation and then developed with a suitable developer to selectively remove the resin of the layer 105, thereby forming the via holes 105a.

Figure 7O:
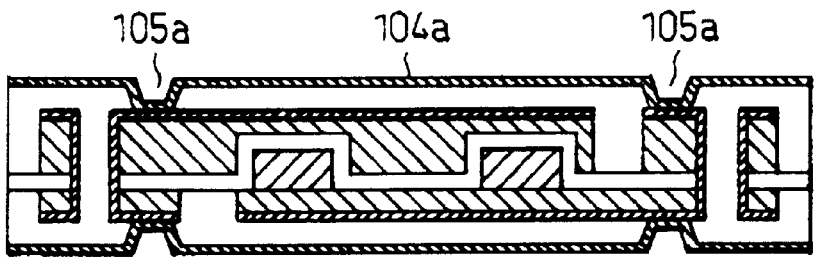

Thereafter, as shown in FIG. 7O, a copper plating layer 104a for forming a wiring is formed on a surface of the via holes-bored lamination product. Although not illustrated, the copper plating layer 104a is preferably formed by fully forming an electroless copper plating layer, followed by forming an electrolytic copper plating layer on the resulting electroless copper plating layer. As a result, a side wall and bottom surface of the via holes 105a are covered with the copper plating layer 104a.

Figure 7P:
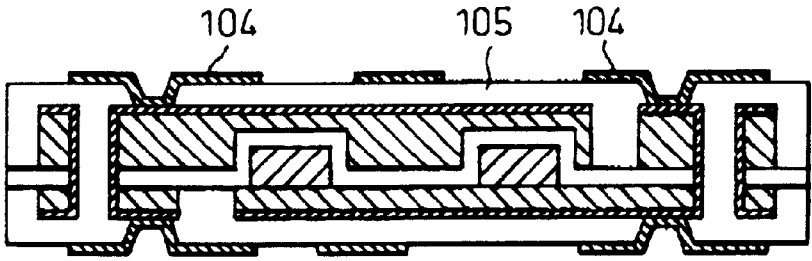

Next, a wiring layer 104 is formed over the interlaminar insulating layer 105 as shown in FIG. 7P. Conventional patterning processes is used to form the wiring layer 104.

After formation of the wiring layer 104, the procedures explained above with reference to FIGS. 7M to 7P are repeated to alternately laminate the interlaminar insulating layer 105 and the wiring layer 104. As mentioned above with regard to the first embodiment of the present invention, the number of the repeated procedures can be varied depending upon the lamination structure of the desired multilayered wiring board.

FIG. 7Q is a cross-sectional view of the multilayered wiring board 205 produced in accordance with the above-described process. The multilayered wiring board 205 corresponds to the multilayered wiring board 205 shown in FIG. 4, and, as can be appreciated from the cross-section of the board, comprises six (6) interlaminar insulating layers 105 and six (6) wiring layers 104, alternately laminated.

In the multilayer wiring board 205, as described above with reference to FIG. 4, a semiconductor element can be mounted, through solder balls, on a predetermined site of the wiring board 205 to form a semiconductor device.

What is claimed is:

1. A multilayered wiring board comprising, at least, two wiring layers and an interlaminar insulating layer sandwiched therebetween, in which said wiring board further has, incorporated therein, at least one capacitor element which comprises a sandwiched structure of:

a lower electrode-forming metallic layer having formed thereon at least one recessed portion, said recessed portion being an extension of said metallic layer beyond said metallic layer each said recessed portion having a side wall and a bottom wall;

a dielectric layer formed over the lower electrode-forming metallic layer having a recessed portion conforming to the recessed portion of said lower electrode-forming metallic layer; and an upper electrode-forming metallic layer formed over the dielectric layer having a recessed portion conforming to the recessed portion of said dielectric layer.

2. The multilayered wiring board according to claim 1, in which said lower electrode-forming metallic layer has a roughened surface to which said dielectric layer is laminated.

3. The multilayered wiring board according to claim 1, in which said wiring board further comprises a bonding strength improving layer between the dielectric layer and the lower electrode-forming metallic layer and the upper electrode-forming metallic layer.

4. The multilayered wiring board according to claim 3, in which said bonding strength improving layer comprises nickel, chromium or an alloy thereof.

5. The multilayered wiring board according to claim 1, in which at least one of said lower electrode-forming metallic layer and said upper electrode-forming metallic layer comprises a metal of the group consisting of copper and a copper alloy.

6. The multilayered wiring board according to claim 1, in which said dielectric layer comprises at least one member selected from the group consisting of PZT (lead zirconate titanate), $BaTiO_2$, $SrTiO_3$ and $Ta_2O_5$.

7. A process for the production of a multilayered wiring board comprising, at least, two wiring layers and an interlaminar insulating layer sandwiched therebetween, and further having, incorporated therein at least one capacitor element, which process comprises the step of forming said capacitor element by:

forming a metallic layer on a substrate;

forming at least one opening on the metallic layer;

applying a surface covering metallic layer over a full surface of the opening-bearing metallic layer to form a lower electrode-forming metallic layer having formed thereon at least one recessed portion extending through said opening and beyond;

depositing a dielectric material over the lower electrode-forming metallic layer to form a dielectric layer, having a surface profile corresponding to that of the underlying lower electrode-forming metallic layer including each said recessed portion extension;

forming an upper electrode-forming metallic layer over the dielectric layer including each said deposited recessed portion extension to complete the resulting capacitor element; and removing the substrate from the resulting capacitor element.

8. The process for the production of a multilayered wiring board according to claim 7, in which said dielectric layer is formed by one of the group consisting of a chemical vapor deposition process and a sputtering process.

9. The process for the production of a multilayered wiring board according to claim 7, in which a surface off said lower electrode-forming metallic layer is roughened after formation of the same.

10. The process for the production of a multilayered wiring board according to claim 7, in which, after the formation of said lower electrode-forming metallic layer and before the formation of said dielectric layer, a bonding strength improving layer is applied to over said lower electrode-forming metallic layer to increase a bonding strength between these two layers.

11. The process for the production of a multilayered wiring board according to claim 7, in which, after the formation of said dielectric layer and before the formation of said upper electrode forming metallic layer, a bonding strength layer to increase a bonding strength between these two layers.

12. The process for the production of a multilayered wiring board according to claim 7, in which said upper electrode-forming metallic layer is formed by forming a layer over the dielectric layer with a metal of the group consisting of copper and a copper alloy, followed by plating a metal of the group consisting of copper and a copper alloy, on a surface of the resulting electrode-forming metallic layer.

13. A process for the production of a multilayered wiring board comprising, at least, two wiring layers and an interlaminar insulating layer sandwiched therebetween, and further having, incorporated therein, at least one capacitor element, which process comprises the step of forming said capacitor element by:

forming a metallic underlayer on a substrate;

further forming a pattern-forming metallic layer over the metallic underlayer;

fabricating a topographic pattern in the pattern-forming metallic layer to form a lower electrode-forming metallic layer comprising the metallic underlayer having applied thereon the patterned metallic layer and having at least one recess in a surface thereof, said recess extending beyond said metallic layer and having a side wall and a back wall;

depositing a dielectric material over the lower electrode-forming metallic layer to form a dielectric layer having a surface profile corresponding to that of the underlying lower electrode-forming metallic layer and each recess extension thereof, forming an upper electrode-forming metallic layer over the dielectric layer and each corresponding recess extension thereof to form the resulting capacitor element; and removing the substrate from the resulting capacitor element.

14. The process for the production of a multilayered wiring board according to claim 13, in which said dielectric layer is formed by a process selected from the group consisting of the group of a chemical vapor deposition process and a sputtering process.

15. The process for the production of a multilayered wiring board according to claim 13, in which a surface of said lower electrode-forming metallic layer is roughened after formation of the same.

16. The process for the production of a multilayered wiring board according to claim 13, in which, after the formation of said lower electrode-forming metallic layer and before the formation of said dielectric layer, a bonding strength improving layer is applied to over said lower electrode-forming metallic layer to increase a bonding strength between these two layers.

17. The process for the production of a multilayered wiring board according to claim 13, in which, after the formation of said dielectric layer and before the formation of said upper electrode-forming metallic layer, a bonding strength improving layer is applied to over said dielectric layer to increase a bonding strength between these two layers.

18. The process for the production of a multilayered wiring board according to claim 13, in which said upper electrode-forming metallic layer is formed by forming a first layer over the dielectric layer with a metal from the group consisting of copper and a copper alloy, followed by forming a second layer by plating with a metal from the group consisting of copper and a copper alloy, on a surface of the first layer.

19. A semiconductor device which comprises a multilayered wiring board comprising, at least, two wiring layers and an interlaminar insulating layer sandwiched therebetween, and further-having, incorporated therein, at least one capacitor element which comprises a sandwiched structure of:

a lower electrode-forming metallic layer having formed thereon at least one recess portion extending there beyond to have a side wall and an end wall;

a dielectric layer formed over the lower electrode-forming metallic layer and each said recess portion thereof;

an upper electrode-forming metallic layer formed over the dielectric layer and each said recess portion thereof; and at least one semiconductor element mounted in or on said multilayered wiring board.

* * * * *